United States Patent
Hekmatpour et al.

(10) Patent No.: US 7,571,184 B2
(45) Date of Patent: Aug. 4, 2009

(54) DYNAMIC SCHEMA-BASED SILICON IP ANALYSIS, QUALIFICATION, DATA EXCHANGE, AND INTEGRATION

(75) Inventors: Amir Hekmatpour, Cary, NC (US); Azadeh Salehi, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 364 days.

(21) Appl. No.: 11/349,846

(22) Filed: Feb. 8, 2006

(65) Prior Publication Data

US 2007/0185898 A1    Aug. 9, 2007

(51) Int. Cl.
*G06F 17/00* (2006.01)
(52) U.S. Cl. .................................... 707/102; 707/104.1
(58) Field of Classification Search ................ 707/100, 707/102
See application file for complete search history.

(56) References Cited

U.S. PATENT DOCUMENTS

| | | | |
|---|---|---|---|
| 5,285,380 A | 2/1994 | Payton | |
| 5,937,407 A | 8/1999 | Sakata | |
| 6,038,566 A | 3/2000 | Tsai | |
| 6,179,486 B1 | 1/2001 | Wallach et al. | |
| 6,202,111 B1 | 3/2001 | Wallach et al. | |
| 6,205,503 B1 | 3/2001 | Mahalingam | |
| 6,219,734 B1 | 4/2001 | Wallach et al. | |
| 6,247,079 B1 | 6/2001 | Papa et al. | |
| 6,324,538 B1 | 11/2001 | Wesinger, Jr. et al. | |
| 6,353,820 B1* | 3/2002 | Edwards et al. | 707/2 |
| 6,418,492 B1 | 7/2002 | Papa et al. | |
| 6,556,983 B1 | 4/2003 | Altschuler et al. | |
| 6,601,075 B1 | 7/2003 | Huang et al. | |
| 6,654,734 B1 | 11/2003 | Mani et al. | |
| 6,687,710 B1* | 2/2004 | Dey | 705/36 R |
| 6,701,321 B1 | 3/2004 | Tsai | |
| 6,711,579 B2* | 3/2004 | Balakrishnan | 707/102 |
| 6,754,664 B1 | 6/2004 | Bush | |
| 7,069,271 B1* | 6/2006 | Fadel et al. | 707/102 |
| 7,127,405 B1* | 10/2006 | Frank et al. | 705/1 |
| 2001/0034733 A1* | 10/2001 | Prompt et al. | 707/102 |
| 2003/0051236 A1* | 3/2003 | Pace et al. | 717/177 |
| 2004/0201600 A1* | 10/2004 | Kakivaya et al. | 345/700 |

* cited by examiner

*Primary Examiner*—James Trujillo
*Assistant Examiner*—Linh Black
(74) *Attorney, Agent, or Firm*—Mark E. McBurney; Schubert Osterrieder & Nickelson PLLC (57) ABSTRACT

Methods for dynamic schema-based silicon IP analysis, qualification, data exchange, and integration are disclosed. Embodiments include determining a new resident schema associated with a function of a silicon IP design system that is different than a previous resident schema associated with a current view. Embodiments further include analyzing components of the new resident schema and parsing the current view and repository or IP database based on the new resident schema to extract pertinent data from the current view and the database and generating a new view by mapping the extracted data to the new resident schema where the new view includes viewable data associated with the function. Further embodiments may include presenting the generated new view to a user or storing the viewable data in a database. The new resident schema may be described in an XML or other appropriate schema language and notations.

7 Claims, 9 Drawing Sheets

DYNAMIC SCHEMA-BASED SILICON IP ANALYSIS, QUALIFICATION, DATA EXCHANGE, AND INTEGRATION

FIELD OF INVENTION

The present invention generally relates to the field of silicon intellectual property—(IP-) based Integrated Circuit (IC) design. More particularly, the present invention relates to methods for dynamic schema-based silicon IP analysis, qualification, data exchange, and integration for IC chip or other silicon designs.

BACKGROUND

Design of an Integrated Circuit (IC) chip such as Application-Specific ICs (ASICs) and system-on-chips (SoC's) is a very complex, expensive, and time-consuming task. To help streamline this task, designers often utilize silicon IPs (also known as intellectual property blocks, IP cores, or integrated circuit macros) to facilitate the design task. IPs are units of reusable design whose use may have been licensed from a third party IP vendor. IPs may represent design components such as processor units, interface protocols, data storage elements, functions, etc. that may be utilized in the design of an ASIC or SoC. IPs commonly take the form of a digital, analog, or mixed signal IC described in a hardware description language (HDL) such as Verilog, VHDL, or System C but may also be represented as a netlist or physical layout. While using IP blocks in a design can provide significant efficiencies when compared with designing a chip at the transistor level or gate level, management of a large number of IP blocks has its own complexities.

As SoCs and other designs grow larger and more sophisticated, the task of integrating complex silicon IP blocks into a system becomes increasingly labor intensive and time consuming. To simplify the use and transfer of IPs, designers often utilize an Extensible Markup Language (XML) Schema such as those compliant with SPIRIT 1.0 XML to create an IP databook in XML to document features and configurability options and also package design data files for an IP. SoC design and stitching tools may use the standard XML Schema (such as the SPIRIT 1.0 XML Schema specification for IP design re-use promulgated by the SPIRIT Consortium) data to automate the painstaking IP integration process, leaving designers with more time to evaluate the performance of the IP block, its behavior and performance in context of the entire system, explore design alternatives, and focus engineering resources on design features that differentiate the end product. IP-based design tools include tools such as Mentor Graphics® Corporation's Platform Express™ for IP-based SoC stitch and design or Synopsys® Corporation's Design-Ware® coreBuilder, coreConsultant, and coreAssembler, both of which support SPIRIT 1.0 XML compliant IP. Accordingly, IP that is packaged and delivered based on the Spirit XML Schema can be brought into these tools for processing. In addition, IPs packaged by Synopsys' coreBuilder can be used in other SPIRIT compliant tools.

While existing tools can accommodate schema compliant with the SPIRIT XML standard, these tools cannot easily handle schema that vary from this standard in structure and content. Schemas comporting to existing schema standards are effectively hardcoded into the architecture of these tools and the tools thus do not satisfactorily support variations or extensions of these schema. If, for example, an organization desired to use a schema that differed from the supported standards, their options would be limited. The organization could request from the SPIRIT consortium (or other standard bodies) to add the requested changes to the existing schema and, once approved, the design tool companies would need to update their system to accommodate the new schema, a process that may take years. In some cases, such a request may also be rejected, leaving the organization with the new schema with no ability to use existing design tools with their schema. There is, therefore, a need for an effective and efficient system to manage schemas for silicon IP that facilitates the use of different types of schemas, including those not part of an existing and supported standard. There is also a need for a flexible schema architecture for silicon IP design and delivery management.

SUMMARY OF THE INVENTION

The problems identified above are in large part addressed by systems, methods, and media for dynamic schema-based silicon IP analysis, qualification, data exchange, and integration. One embodiment generally provides a method for dynamically adjusting system features based on a schema. The method may generally include determining a new resident schema associated with a function of a silicon IP design system, the new resident schema being different than a previous resident schema associated with a current view. The method may further include analyzing components of the new resident schema and parsing the current view based on the new resident schema to extract data from the current view. The method may further include generating a new view by mapping the extracted data to the new resident schema where the new view includes viewable data associated with the function of the design system. Further embodiments may include after generating the new view, presenting the generated new view to a user or storing the viewable data in a database. The new resident schema may be an XML or other type of schema.

BRIEF DESCRIPTION OF THE DRAWINGS

Advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Methods for dynamic schema-based silicon IP analysis, qualification, data exchange, and integration are disclosed. Embodiments may generally include determining a new resident schema associated with a function of a silicon IP design system, the new resident schema being different than a previous resident schema associated with a current view. The method may further include analyzing components of the new resident schema and parsing the current view and repository or IP database based on the new resident schema to extract pertinent data from the current view and IP database. The method may additionally include generating a new view by mapping the extracted data to the new resident schema where the new view includes viewable data associated with the function of the design system. Further embodiments may include after generating the new view, presenting the generated new view to a user or storing the viewable data in a database. The new resident schema may be described in XML or other appropriate schema language and notations.

Figure 1:
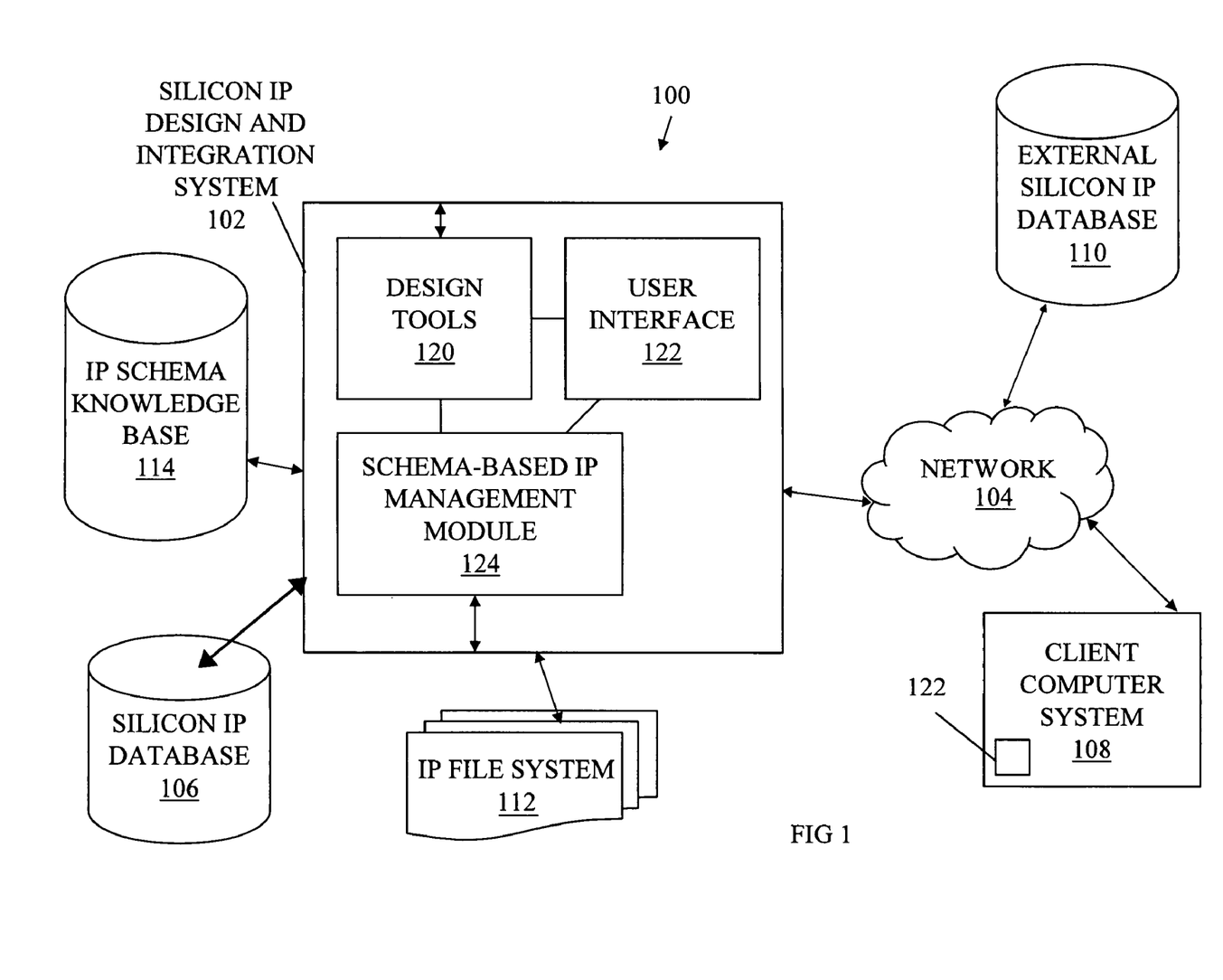
FIG. 1 depicts a schematic view of a silicon IP design and integration environment with a silicon IP design system having a schema-based IP management module according to one embodiment.

The methods of the disclosed embodiments may provide an improved methodology for IP request generation, IP vendor evaluation and qualification, IP submission for standards-compliance analysis and qualification, IP qualification for design collaboration and future engagement recommendation, IP design data exchange and certification, or other tasks associated with the use and integration of silicon IPs with ASIC or SoC design. The disclosed methodologies may also provide for a set of self-configurable functions, data generators, data collectors, and report generators that are schema-aware. System features and schema attributes may be dynamically bound at run-time, which may advantageously provide a flexible and configurable system that can accommodate various IP schema standards. The disclosed system of some embodiments may parse and identify schema elements and meta-data pertinent to a called function, resolve and map new data to an existing schema, and resolve feature conflict when missing schema elements or element values. By dynamically upgrading or replacing a resident schema and automatically adjusting the corresponding system features and functions, a flexible and dynamic schema-based system for silicon IP management may be achieved Turning now to the drawings, FIG. 1 depicts a schematic view of a silicon IP design and integration environment with a silicon IP design system having a schema-based IP management module according to one embodiment. Silicon IP design and integration environment 100 may include a silicon IP design and integration system 102 that may provide for designing SoCs, ASICs, or other ICs using design tools and incorporating one or more IPs in the design. As will be described in more detail subsequently, the silicon IP design and integration system 102 may utilize a dynamically hot-swappable schema architecture to manage IPs used in the SoC and ASIC designs. Schemas may, among other things, represent a description of the inputs, outputs, functionality, and interface protocols of an IP, serving as a free-format template with the requirements and data necessary to integrate an IP into a design. A designer (or design tool) may utilize the schema representing an IP to identify the type and format of available design data for an IP so that the IP may be efficiently unpacked, potentially eliminating the need to analyze and guess what has been delivered with an IP and in what format. Schemas may be defined consistent with a standard such as the SPIRIT XML v1.0 standard so that users who know of the standard may quickly ascertain what kind of data is delivered with the IP, the contents and data type of the design files, etc. The disclosed system may utilize a higher-level general description instead of hardcoded schema requirements to advantageously allow the use of any types of schema, including variations or extensions of schema consistent with the SPIRIT or other standards. While schemas may be in XML or any other format, they are described herein as XML schemas. One skilled in the art will recognize that the schemas may be in any schema language or format now existing or later developed.

The silicon IP design and integration environment 100 may include a silicon IP database 106 for storage of IP specifications, schemas, design file descriptions and location references. The silicon IP database 106 may be in communication with the silicon IP design and integration system 102. The silicon IP design and integration system 102 may also be in communication with one or more client computer systems 108 and/or an external silicon IP database 110 via network 104 as part of the silicon IP design and integration environment 100. Users may utilize a client computer system 108 to access the silicon IP design and integration system 102, such as by web-based application or other means. The external silicon IP database 110 may be any public or proprietary database of IPs that may be utilized in conjunction with the silicon IP design and integration system 102 to provide additional IPs for use by designers. Example external silicon IP databases 110 may include IP repositories such as Virtual Component Exchange Ltd.'s (VCX) Virtual Component Exchange, Design & Reuse Software's (D&R) Web portal, etc. The silicon IP design and integration system 102 may advantageously accommodate external IPs in addition to internal or company IPs by use of its dynamic architecture. System 100 may also include an IP file system 112 for storage of IP files and an IP schema knowledge base 114 for storage of rules and heuristics for how to analyze and interpret IP schemas.

Network 104 may be any type or combination of data communications channels, such as the Internet, an intranet, a LAN, a WAN, an Ethernet network, a wireless network, a proprietary network, a broadband cable network, or combination thereof. The Internet or other public network may be particularly useful as network 104 when the client computer systems 108 are widely distributed from the silicon IP design and integration system 102 as communications between these systems will be facilitated. Similarly, a corporate intranet may serve as network 104 for communications within an internal corporate computing environment. Those skilled in the art will recognize, however, that the invention described herein may be implemented utilizing any type or combination of data communications channel(s).

In the silicon IP design and integration environment 100, any of the silicon IP design and integration system 102, the silicon IP database 106, IP file system 112, the external silicon IP database 110, IP schema knowledge base 114, or any client computer systems 108 may be located at the same location, such as in the same building or computer lab, or could be remote. While the term "remote" is used with reference to the distance between the components of the silicon IP design and integration environment 100, the term is used in the sense of indicating separation of some sort, rather than in the sense of indicating a large physical distance between the systems. For example, any of the components of the silicon IP design and integration environment 100 may be physically adjacent or located as part of the same computer system in some network arrangements, such as when the silicon IP design and integration system 102 and the silicon IP database 106 are part of the same computer system. Those skilled in the art will recognize, however, that the invention described herein may be implemented utilizing any type or combination of computer systems.

The silicon IP design and integration system 102 (as well as other components of the silicon IP design and integration environment 100 such as a client computer system 108) may, in one embodiment, be software implemented on one or more of any type of computer system, including servers, personal computers, workstations, mainframe computers, notebook or laptop computers, desktop computers, or the like. In one example, the silicon IP design and integration system 102 may be implemented on an IBM® eServer or similar server having one or more processors, or threads of processors, executing software and/or one or more state machines coupled with data storage devices such as random access memory (RAM), read only memory (ROM), flash memory, compact disk drives, hard drives, and the like. In one example, the silicon IP design and integration system 102 may be an application server where the schema-based IP management module 124 may be implemented as a Web-based application accessible by a plurality of users on client computer systems 108. In this example, the users may utilize a browser executing on client computer system 108 to interact with the silicon IP design and integration system 102. The browser may be a graphical browser application that allows a user to view Internet or intranet content such as Microsoft Corporation's Internet Explorer™, Netscape Communication Corporation's Navigator™, Mozilla Foundation's Mozilla, Apple Corporation's Safari™, etc.

The silicon IP design and integration system 102 may include one or more SoC, ASIC, or IC design tools 120, a user interface 122, and a schema-based IP management module 124. SoC, ASIC, or IC design tools 120 may include tools for IP-based design and integration such as Mentor Graphics® Corporation's Platform Express™ tools or Synopsys® Corporation's DesignWare® tools, as well as any other publicly-available or proprietary tools. The user interface 122 may receive input from users and provide output to users to and from the silicon IP design and integration system 102. Any mechanisms or methodologies for receiving input (e.g., keyboard, mouse, user interface, voice command, etc.) or providing output (e.g., display, audio output, printouts, etc.) may be used. The user interface 122 may be executing on the silicon IP design and integration system 102 and/or client computer systems 108. In one embodiment, a user may access the silicon IP design and integration system 102 (and its schema-based IP management module 124) via a wired or wireless connection to the Internet or other network utilizing a web-based user interface 122 executing on a client computer system 108. This embodiment may advantageously provide a Web-based and graphical or visual interface accessible by a distributed design team.

The schema-based IP management module 124, as will be described in more detail subsequently (particularly in relation to FIGS. 2-3), may facilitate the use of different schemas to drive the environment for IP-based design. The XML schema-driven system may provide a flexible and configurable system for IP request generation (for sales, marketing, and field application engineers), IP vendor evaluation and qualification for design cooperation, IP submission for standards-compliance analysis and qualification, IP qualification for design collaboration and future engagement recommendation, IP design data exchange and certification for ASIC and SoC methodologies, or any other function. For purposes of this description, functions shall include IP-related functions, data generators, data collectors, report generators, or any application which utilizes formatted data. The disclosed system may provide self-configurable functions, data generators, data collectors, and report generators that are schema-aware, allowing each to work directly from and based on an XML schema without the schema itself being hardcoded into their definition. This may be accomplished by a dynamic binding of features and schema attributes at run-time and may advantageously allow for the use of any IP schema with different structure and/or content, including those that are different than existing standards such as the SPIRIT XML compliant schemas.

Figure 2:
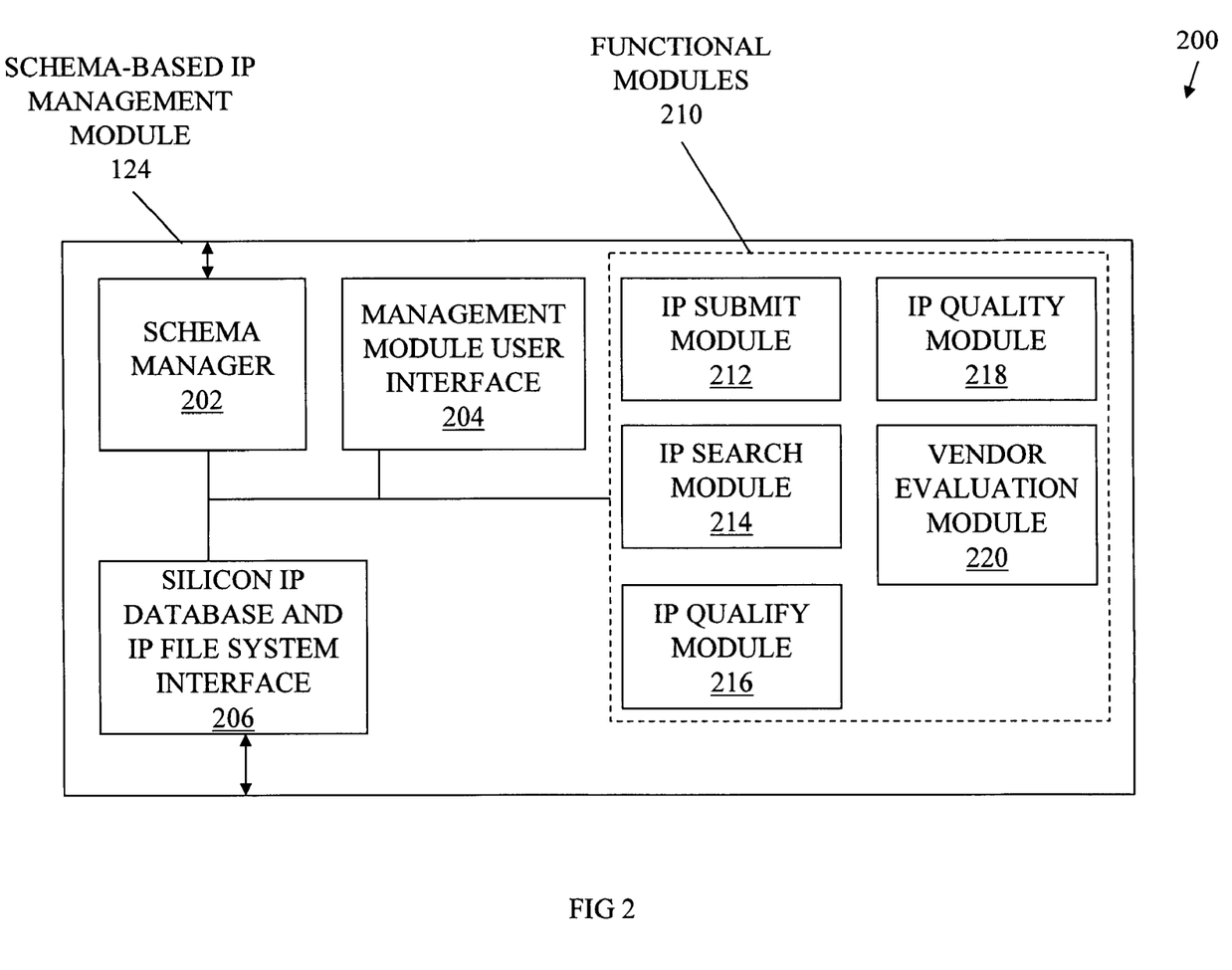
FIG. 2 depicts a conceptual illustration of software components of the schema-based IP management module of FIG. 1 according to one embodiment.

FIG. 2 depicts a conceptual illustration of software components of the schema-based IP management module of FIG. 1 according to one embodiment. In the disclosed embodiment, the schema-based IP management module 124 includes a schema manager 202, a management module user interface 204, a silicon IP database and file system interface 206, and one or more functional modules 210. The schema manager 202 may, in conjunction with one or more functional modules 210, reconfigure the functions, reports, and data models (collectively called the view) associated with a function of the schema-based IP-management module 124. The schema manager 202 may reconfigure the view based on a particular schema and its components, data types, usage rules, etc. This may provide XML schema-driven functions and views of the design space to users that are based on a custom XML schema, facilitating a self-adjusting data model and operation environment. Operation of the schema manager 202 allows for 'hot-swapping' of XML schemas so that succeeding functions and operations are configured and performed based on the new schemas.

To accomplish these tasks, the schema manager 202 may, in response to a function, operator, or data model being called, identify and initialize the active schema, parse the schema to identify constructs relevant to the current function, identify components relevant to the actual content and scope of the active schema, and generate a view for the new schema. Accordingly, when a user selects a function, for example, the schema manager 202 uses the resident (active) schema to construct a user interface that has only the elements required for that schema and satisfies all requirements of the schema. Results from that function may similarly be mapped according to the schema to provide a customized and consistent output.

The management module user interface 204 may receive inputs from a user or provide outputs to a user, such as by operating in collaboration with a user interface 122 of a client computer system 108 or the silicon IP design and integration system 102. The silicon IP database and IP file system interface 206 may provide for communications to and from the schema-based IP management module 124 and the silicon IP database 106, external silicon IP database 110, or IP file system 112.

The schema-based IP management module 124 may include one or more Functional modules 210. The depicted embodiment includes as examples an IP submit module 212, an IP search module 214, an IP qualify module 216, an IP quality module 218, and an vendor evaluation module 220. One of ordinary skill in the art will recognize, however, that any type of functions, including those not yet existing, may be included in the one or more Functional modules 210. The IP submit module 212 may be used by IP developers or vendors who desire to submit an IP to the silicon IP design and integration environment 100 for use, evaluation, or consideration. The IP search module 214 (which may also be known as an IP request module) may allow system designers, system architects, and marketing representatives to search for and access an IP that meets their specified requirements. The IP search module 214 may receive a search request and then search either local or remote IP repositories to find IPs that meet the compiled attributes based on the resident (active) schema.

The remaining example functional modules relate to the quality of an IP or its vendor. The IP qualify module 216 may qualify IPs, such as those submitted using the IP submit module 212. Qualification of IPs may include an assessment of the contents of an IP package (which may include the collection of IP design files, rules, models, or other items bundled and delivered with an IP design) for completeness and correctness as well as the assignment of a qualification level (i.e., gold, silver, etc.) to an IP based on design files and models provided in the delivered IP package. Qualification may also include an analysis of whether the IP meets certain performance requirements, such as power consumption, or whether particular aspects are included, such as a detailed simulation model or HDL code in a particular language. The IP quality module 218 may analyze the IP based on a particular quality standard. For example, the quality module 218 may seek out information pertaining to a company's own IP quality standards or may utilize other quality standards such as the QIP spreadsheet from the VSI Alliance™. The vendor evaluation module 220 may be used to evaluate and qualify IP vendors themselves (instead of the particular IPs). Vendor evaluations may pertain to business or legal requirements in addition to design practices and include information such as company information, the number of successful IPs the company has sold, references, etc. In some embodiments, vendors who have been successfully evaluated may then submit IPs using the IP submit module 212.

Figure 3:
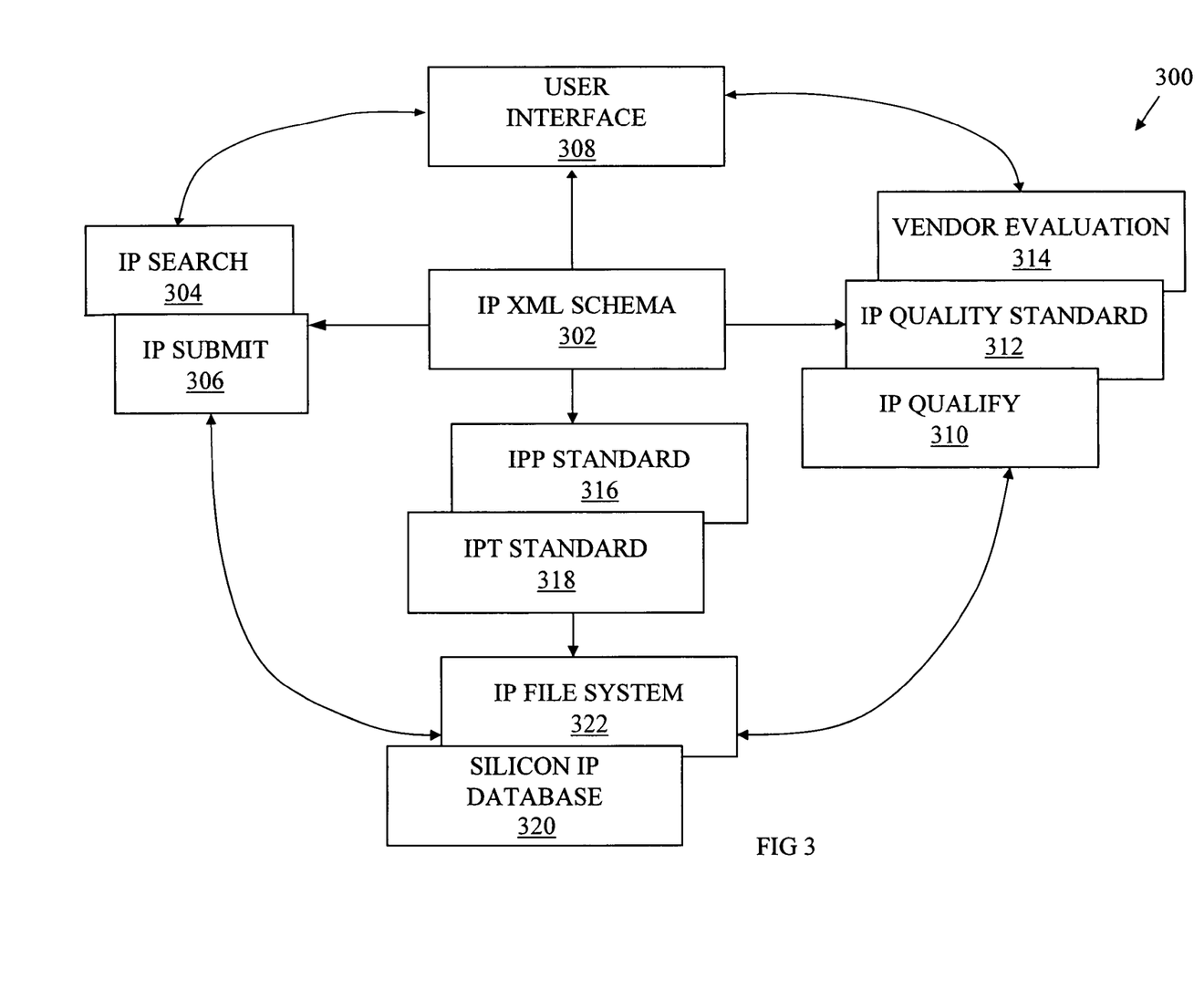
FIG. 3 depicts a functional block diagram representing the architecture and operation of the silicon IP design and integration environment according to one embodiment.

FIG. 3 depicts a functional block diagram representing the architecture and operation of the silicon IP design and integration environment according to one embodiment. Environment 300 may schematically represent the XML schema-based adaptation of the silicon IP design environment during operation. The IP XML schema 302 may represent the specific instance of an XML schema to be used as the resident schema for a particular operation (i.e., performance of a function, generation of a view, etc.). The user interface 308 may represent the view presented to a user and may be driven by mapping the instantiated IP XML schema 302 to the different functions. The user interface 308 may be Web-based in some embodiments and may reconfigure itself based on, for example, the available and pertinent functions after analysis of the active schema. In one example, if a new schema does not include information about power consumption any power-related user interfaces (e.g., a power button) may be eliminated, grayed out, or otherwise minimized. The other functions and components of environment 300 are also driven by the IP XML schema 302, as will be described in more detail. As will be shown, the silicon IP design and integration environment 100 may use the IP XML schema 302 to reconfigure input to the system, the availability or operation of functions, the output of the system, and storage of data on the backend of the system.

The IP search 304 function and the IP submit 306 function may be driven by the IP XML schema 302 as the resident schema. For the IP search 304 function (which may be executed by the IP search module 214), the resident IP XML schema 302 may thus drive the information displayed to the user (such as query attributes and searchable parameters) as well as the information received from a user (by modifying the user interface 308). The IP search 304 function thus does not require a hardcoded interface or format as the IP XML schema dynamically generates the search request screen shown to a user, including the arrangement, content, etc. The IP XML schema 302 provides the required fields for the search request, not the function itself, enabling the use of any type of schema. A user desiring to search IPs approved by the company's microelectronics group, for example, may be shown a search template defined by a schema associated with that group. When a user requests a search by filling out the template and submitting a request, the IP search module 214 may search the appropriate IP repositories and retrieve search results. The search results may also be mapped to the resident IP XML schema 302 to provide search results with a consistent format and selection of information. The IP search function 304 self-configures the user views based on the active IP XML schema 302.

Similarly, the IP submit 306 function (which may be executed by the IP submit module 218) may facilitate submission of IPs to the silicon IP design and integration system 102 for evaluation and qualification. The IP submission module interface and features may be driven by the active (resident) IP XML schema 302. In one example, different organization or different groups within an organization may have different requirements and thus may each have different IP XML schemas 302. When an IP vendor selects a submission function for a particular group, the group's IP XML schema 302 may be instantiated and used to generate the template's interface and features. Moreover, if a user makes particular selections on the template, additional options may appear or disappear based on the resident schema. In one example, an IP vendor submitting an IP might indicate that they are submitting the IP for a specific process technology, resulting in another schema becoming active and the submit template further changing (e.g., such as by new, different, or fewer questions). By having particularized schema for a particular group or function, submitting users may advantageously know the data, format, languages, design file, models, rules, etc. they need to provide for a successful and complete submission of their IP.

The resident (active) IP XML schema 302 may also drive the IP qualify 310, IP quality standard 312, and vendor evaluation 314 functions. The IP qualify 310 function (which may be executed by the IP qualify module 216) may analyze and potentially qualify submitted IPs based on one or more qualification requirements. A qualified IP may then be available to designers or others for use in designs. Qualification of IPs may occur, for example, upon request by an IP vendor, may automatically occur from an IP repository, or may automatically be requested when new IPs are submitted. The IP XML schema 302 for a particular qualification requirement may drive the user interface 304 of the user submitting an IP for qualification and may similarly drive the results page describing whether the IP was qualified, what would need to be done to achieve this or higher qualification levels, etc. An IP may be qualified based on any number of factors, such as performance, power requirements, the existence of a detailed simulation model, a specific type of design language, process technology, etc. Using the IP qualify function 310 and customized IP XML schema, an organization may thus define and enforce its own IP qualification requirements and ranking mechanism.

The IP quality standard 312 function (which may be executed by the IP quality module 218), similarly to the IP qualify 310 function, may facilitate application of an industry-standard quality metric. Any type of quality metric may be used and each may have its own schema 302 that is active when the IP quality module 218 is called, allowing for customized views for each particular quality standard. A spreadsheet-based data entry and result presentation, for example, may have all the fields necessary for an analysis consistent with a particular standard (e.g., the VSI QIP standard).

The vendor evaluation 314 function (which may be executed by the vendor evaluation module 216) may facilitate evaluation of a vendor, its design and verification practices, a vendor's deliverables, business or legal requirements, or any other aspects relevant to evaluation of a vendor for suitability as an IP supplier. Upon receiving the vendor information, the vendor evaluation 314 function may either assign an evaluation level to the vendor (e.g., pass/fail, preferred vendor, certified partner, etc.) and/or notify the vendor of missing, incorrect, or unsatisfactory information. Different classes of IPs, vendor statuses (such as partnerships), organizational groups, etc. may have different templates generated by their own IP XML schemas 302. A vendor seeking to become a preferred vendor, for example, would be presented with the template based on the preferred vendor IP XML schema 302 instead of the lower-level schema.

The disclosed system may also be utilized with IP protection (IPP) standards 316, IP Transfer (IPT) standards 318, or other standards. The resident (active) schema may be updated to reflect the attributes of any such standard. If a designer is working with a company using a specific IPP 316 or IPT 318 standard (e.g., the Spirit IPT or VSI IPP), the environment 300 may export an IP consistent with those standards that may then be passed to the other tools requiring IP data in that format. The disclosed system may be utilized with multiple IPP, IPT, or other standards. In this way, the disclosed system accommodates the inflexibility of many existing tools by exporting schema data to their formats. The instantiated schema can be saved to the silicon IP database 320 according to a specific IPT standard 318 or be upgrade to reflect specific requirements of a specific IPP standard 316.

The silicon IP database 320 and/or IP file system 322 may receive IP specifications, design data or other information from any of the functions. The IP submit 306 function, for example, may store submitted IPs and related information entered by the user in the silicon IP database 320 and/or IP file system 322. Other functions may similarly store received or generated information in the silicon IP database 320 and/or IP file system 322. The silicon IP database 320 and/or IP file system 322 (which may be located on silicon IP database 106 of FIG. 1) may store information in any database format, such as MySQL, DB2, SQL, etc. The IP file system 322 may be implemented on any commercial or proprietary file system such as Unix file system UFS, HFS MaC™ OS file system, Windows® NTFS and EFS file systems, etc.

Figure 4:
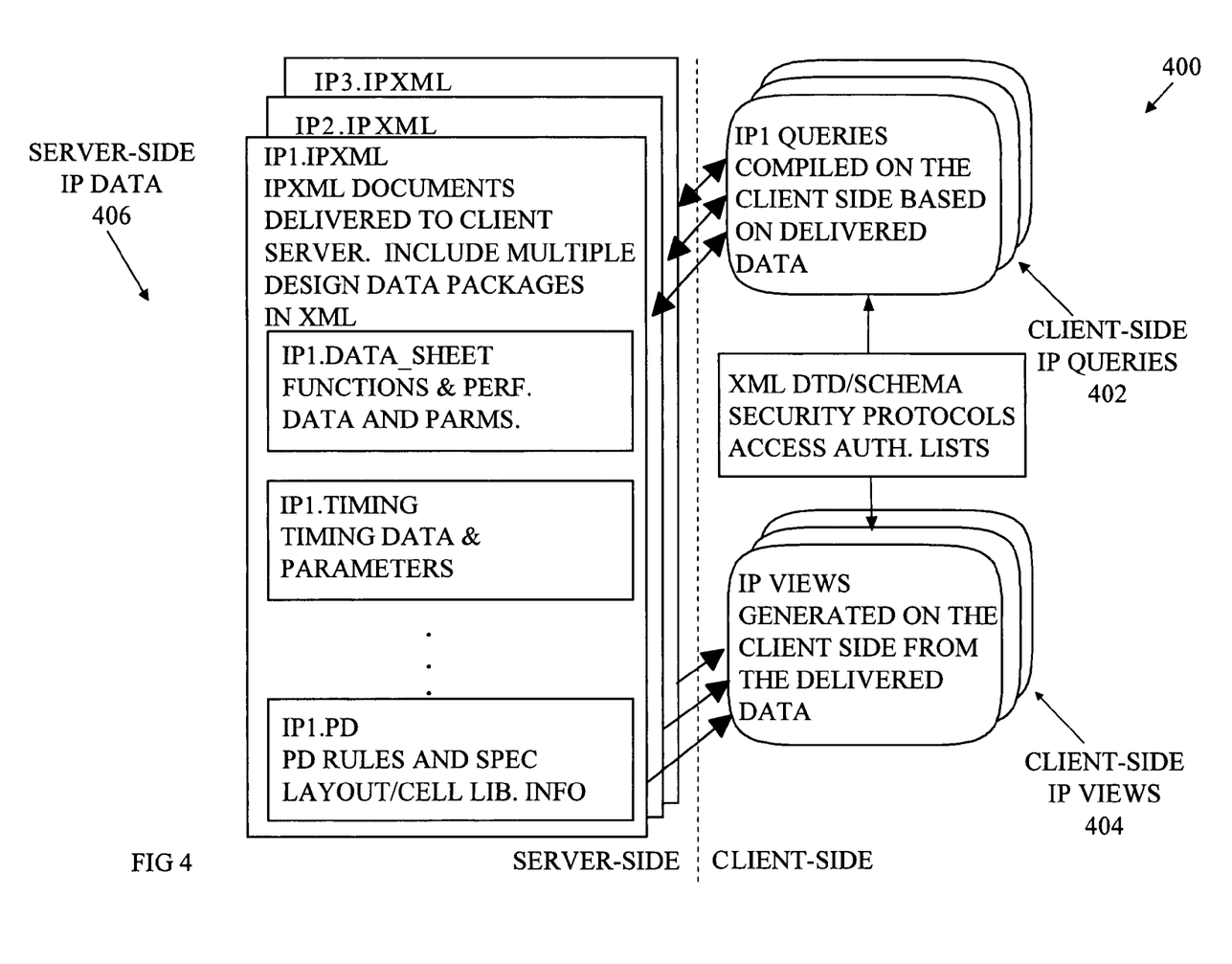
FIG. 4 depicts a schematic view of a schema-based query and presentation performed on the client-side according to some embodiments.

FIG. 4 depicts a schematic view of a schema-based query and presentation performed on the client-side according to some embodiments. In the embodiment of FIG. 4, information being used to fill in a template may be stored on the client-side until completion of the template. A client-side IP query 402 may be generated by a server (such as the silicon IP design and integration system 102) from server-side IP data 406 to generate a template based on the appropriate schema and the client-side IP query 402 may then be transmitted to the client-side (such as a client computer system 108) for viewing and completion of the template in a client-side IP view 404. Programs to manage data entry, error detection or other functions may be delivered and executed on the user's system until the template is completed and submitted. This may be particularly useful in situations where vendors or other users may not wish to submit information (and others may not want to receive information) until the client has agreed to legal terms. Once the vendor has completed the template (and agreed to the legal terms), they may submit the template for analysis and evaluation (402) or receive additional information in a transmitted IP view 404. Alternatively, the operations of the silicon IP design and integration system 102 may be executed on the server-side or on a combination of both the client and server, and those skilled in the art will recognize that execution of operations may occur wherever necessary to satisfy computational, storage, legal, business, or other requirements. Such requirements may be reflected in the resident schema of the system 302 and enforced by various functions 304, 306, 314, etc.

Figure 5:
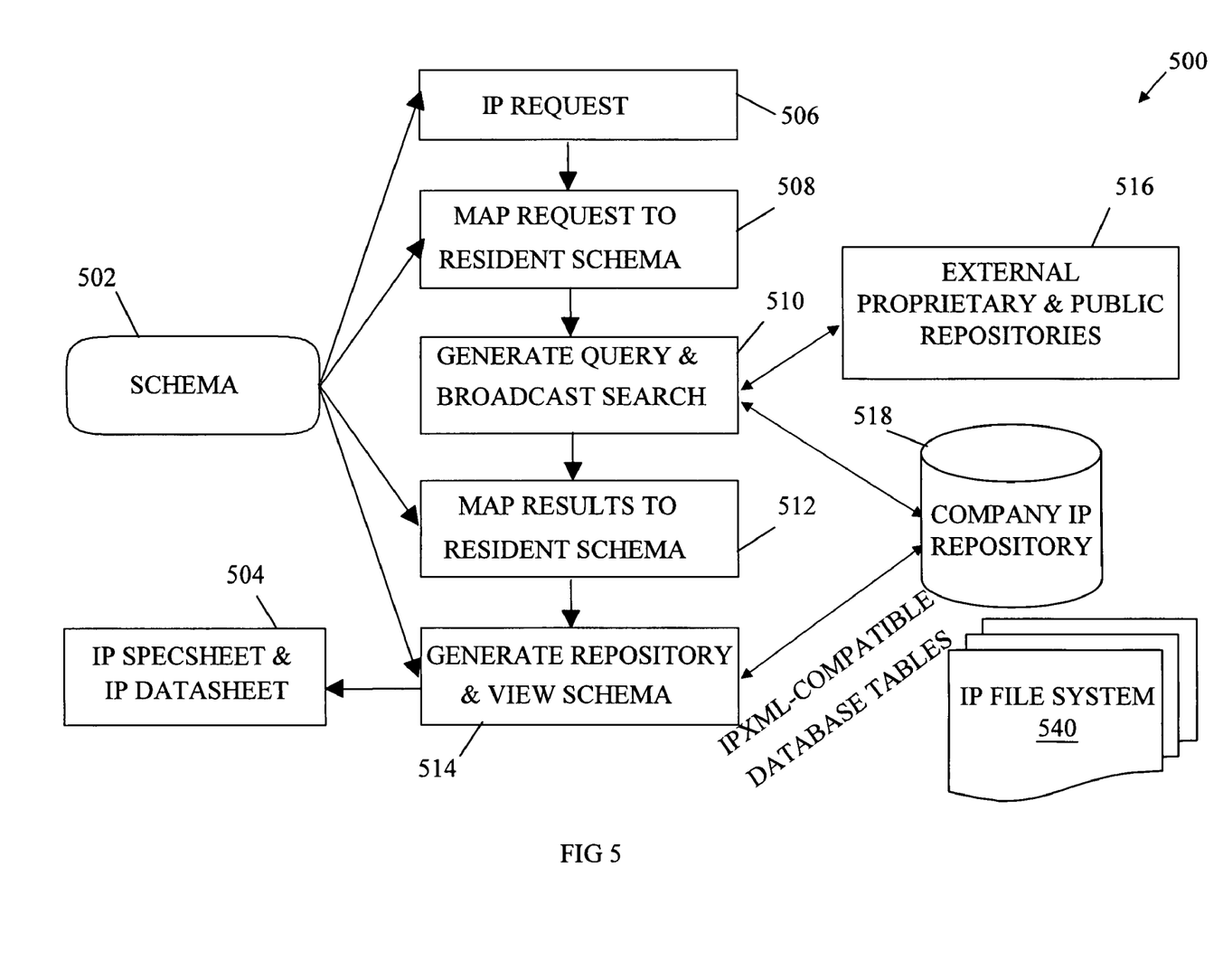
FIG. 5 depicts a schematic view of a schema-based IP search or request function according to one embodiment.

FIG. 5 depicts a schematic view of a schema-based IP search or request function according to one embodiment. As discussed previously, the IP request (or search) function may be used by a designer or other user searching for an IP that meets particular characteristics. Each of the different aspects of the IP request (or search) function may be configured based on the schema 502 (e.g., IPXML schema) active at run-time of the function. The IP search module 214 may generate an IP search query at block 506 that is configured and instantiated based on the resident schema. Once a request is submitted, the IP search module 214 may at block 508 map the request (i.e., the IP attributes and value ranges) into the resident schema 502 to insure that the data is consistent and that the provided data meets requirements. Any additional data, such as that submitted via comment field, may be matched to a component of the schema as part of the mapping. Any IP specification or design data that does not fit the resident schema may be tagged as 'MISC' data for storage in a 'MISC' database field.

Once an IP request has been submitted and mapped, the IP search module 214 may (at block 510) generate a search request and broadcast the search to the appropriate databases or repositories. In one embodiment, the search may be broadcast to the company IP repository 518 (such as the silicon IP database 106). In other embodiments, the search may be broadcast to one or more external proprietary and public repositories 516 (such as the external silicon IP databases 110) instead of or in addition to the company database. The search query may be configured for either (or both) local or remote search and may be modified based on the resident schema. At block 512, the IP search module 214 may map the received search results to the resident schema 502 so that the search results (which may be received from different sources) are consistent in data and format.

At block 514, the IP search module 214 may generate a schema-based view of the external returned results and store the result in the company IP repository 518 in a temporary table (e.g., an IP XML-combatible MySQL, DB2, etc. table). The IP search module 214 may also generate a user view based on the resident schema by a standard display function such as IP SpecSheet or IP DataSheet at block 504 and presented to the user. The user may perform a quality analysis or qualification on any external IPs they select from the search results and the selected external IPs may then be submitted to the company IP repository and/or IP file system 540 using the standard submit IP process.

Figure 6:
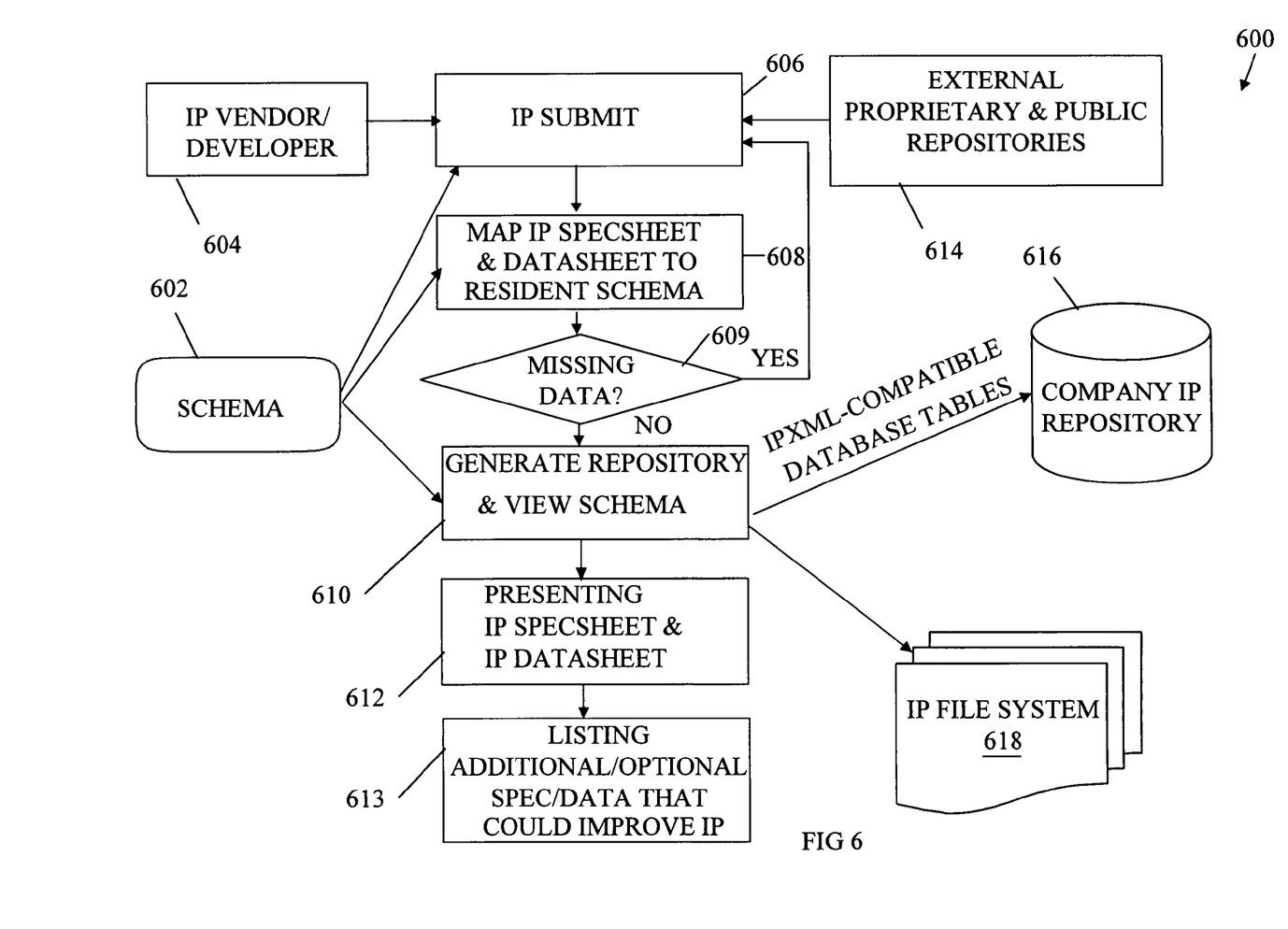
FIG. 6 depicts a schematic view of a schema-based IP submit function according to one embodiment.

FIG. 6 depicts a schematic view of a schema-based IP submit function according to one embodiment. As discussed previously, the IP submit function may be used to submit an IP to the system for evaluation and use. Each of the different aspects of the IP submit function may be configured based on the schema 602 (e.g., IPXML schema) active at run-time of the function. An IP can be submitted to the system at block 606 from either an IP vendor or developer 604 or from external proprietary and public repositories 614. The IP submit template may be generated based on the resident schema 602. Once data is submitted, the IP submit module 212 may at block 608 map the IP submit data (i.e., the completed submit forms and information about all uploaded IP design files, rules, models, testbenches, etc.) into the resident schema 602 to insure that the data is consistent, the data is in the correct format and that the provided data meets any requirements. If there is missing mandatory data (at decision block 609), the user may be presented with the option to resubmit the IP at element 606.

Once IP data and attributes of design files have been mapped to the resident schema, the IP submit module 212 may at block 610 then store the instantiated schema in the company IP repository 616 in a table format for either temporary or long-term storage. Submitted IP design files, rules, models, testbenches, documents, etc. may be stored in the IP file system 618 and their location, name, type, size, date of submission, etc. may be stored in the corresponding tables in the company IP repository 616. The IP submit module 212 may also generate a user view at block 610 based on the resident schema by a standard display of IP SpecSheet or IP DataSheet at block 612 and presented to the user. The user may then confirm that the information they submitted is correct, that there were no errors in translation, that assumed attributes and data were reasonable, etc. In some embodiments, discrepancies in the submitted data from the desired information may be pointed out at element 613 by presenting a list of additional or optional specifications or data that could improve searchability or qualification of this IP. For example, if the resident schema 602 required a VHDL or Verilog source code file and a SystemC file was instead submitted, the user could be notified that their IP could be tentatively accepted but could not be qualified. The user could then resubmit a different version of their source code file if desired.

Figure 7:
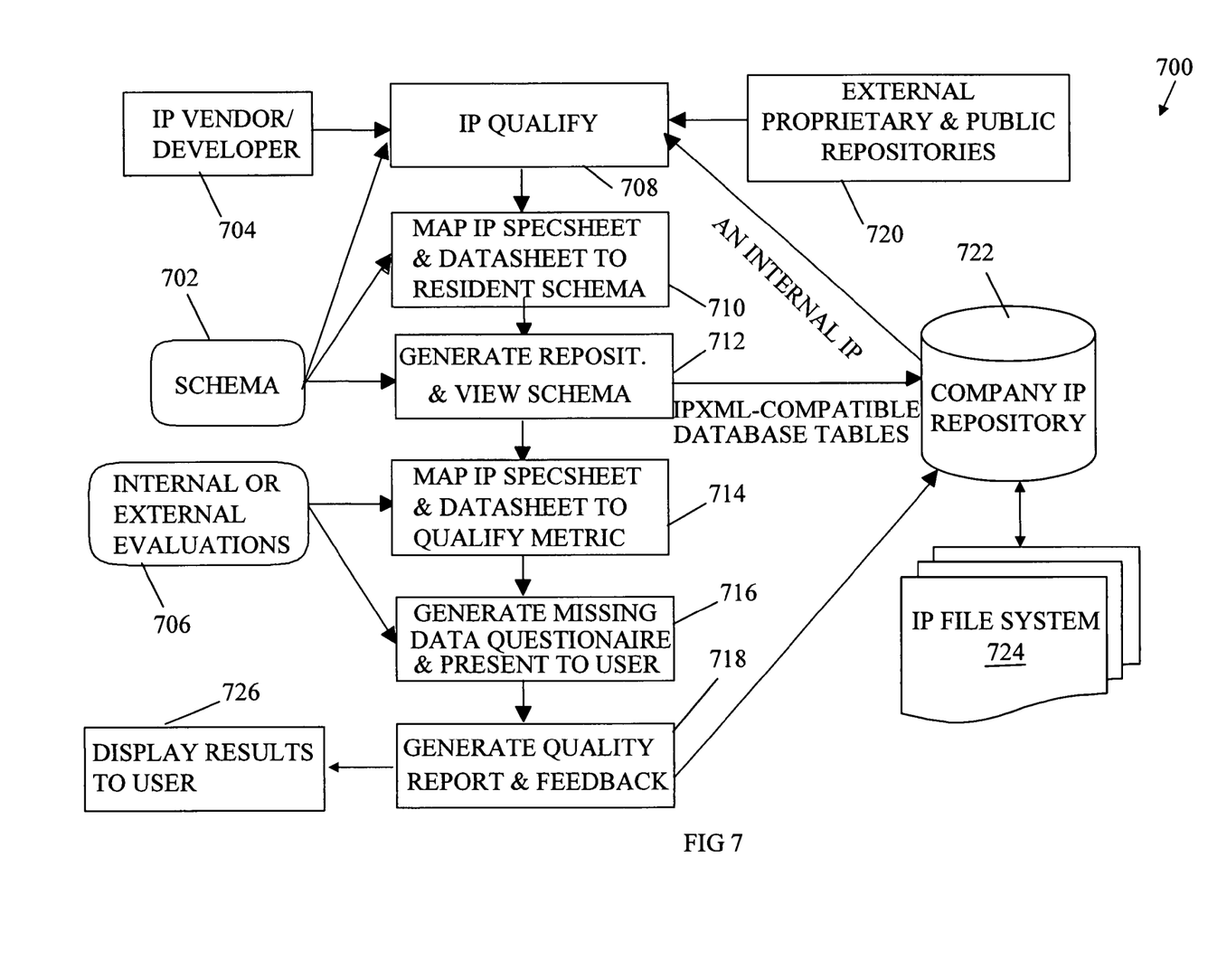
FIG. 7 depicts a schematic view of a schema-based IP qualification function according to one embodiment.

FIG. 7 depicts a schematic view of a schema-based IP qualification function according to one embodiment. As discussed previously, the IP qualification function may be used to qualify an IP once its internal schema has been generated, populated, and stored. Each of the different aspects of the IP qualification function may be configured based on the schema 702 active at run-time of the function and may be executed by an IP qualify module 216. The qualification of a recently-submitted IP or one available in an IP repository starts at block 708 by a request by either an IP vendor or developer 704 or from external proprietary and public repositories 720. Internal IPs stored in the company IP repository 722 may also be submitted for qualification, such as when one group in an organization desires to qualify an IP already qualified for another group (i.e., a group with a different schema) or if the IP specification or design has been updated. The IP qualification template (including the information necessary for qualification) may be generated based on the resident schema 702. Once data is submitted, the IP qualification module 216 may at block 710 map the IP qualification template into the resident schema 702 to insure that the data is consistent, the data is in the correct format and that the provided data meets any requirements. Any necessary and possible data conversion, design rule generation, design circuit analysis, signal integrity check, parasitic extraction, EM and Hot-e analysis, etc., may be performed as a part of IP qualification. These may be applied to design files, rules, and models available for the IP in the IP file system 724 and repository 722.

Once an IP has been submitted and mapped to the resident schema, the IP qualification module 216 may at block 712 then store the generated and populated (instantiated) schema in the company IP repository 722 in a table format for either temporary or long-term storage. The IP qualification module 216 may also generate a user view at block 712 based on the resident schema and any generated design characteristic. The user may then confirm that the information they submitted is correct, that there were no errors in translation, that assumed attributes and data were reasonable, etc. At block 714, the IP qualification module 216 may map the view to a qualification metric to qualify the IP itself. The mapping of block 714 may be based on the resident XML schema and may be based on one or more internal or external evaluation quality metrics. The IP qualification module 216 may generate a missing data questionnaire and present it to the user at block 716 if any data is missing or incorrect in the IP. If the IP is qualified, the IP qualification module 216 may generate a quality report and store it in the company IP repository 722 with the associated IP and schema and display results to the user at block 726.

Figure 8:
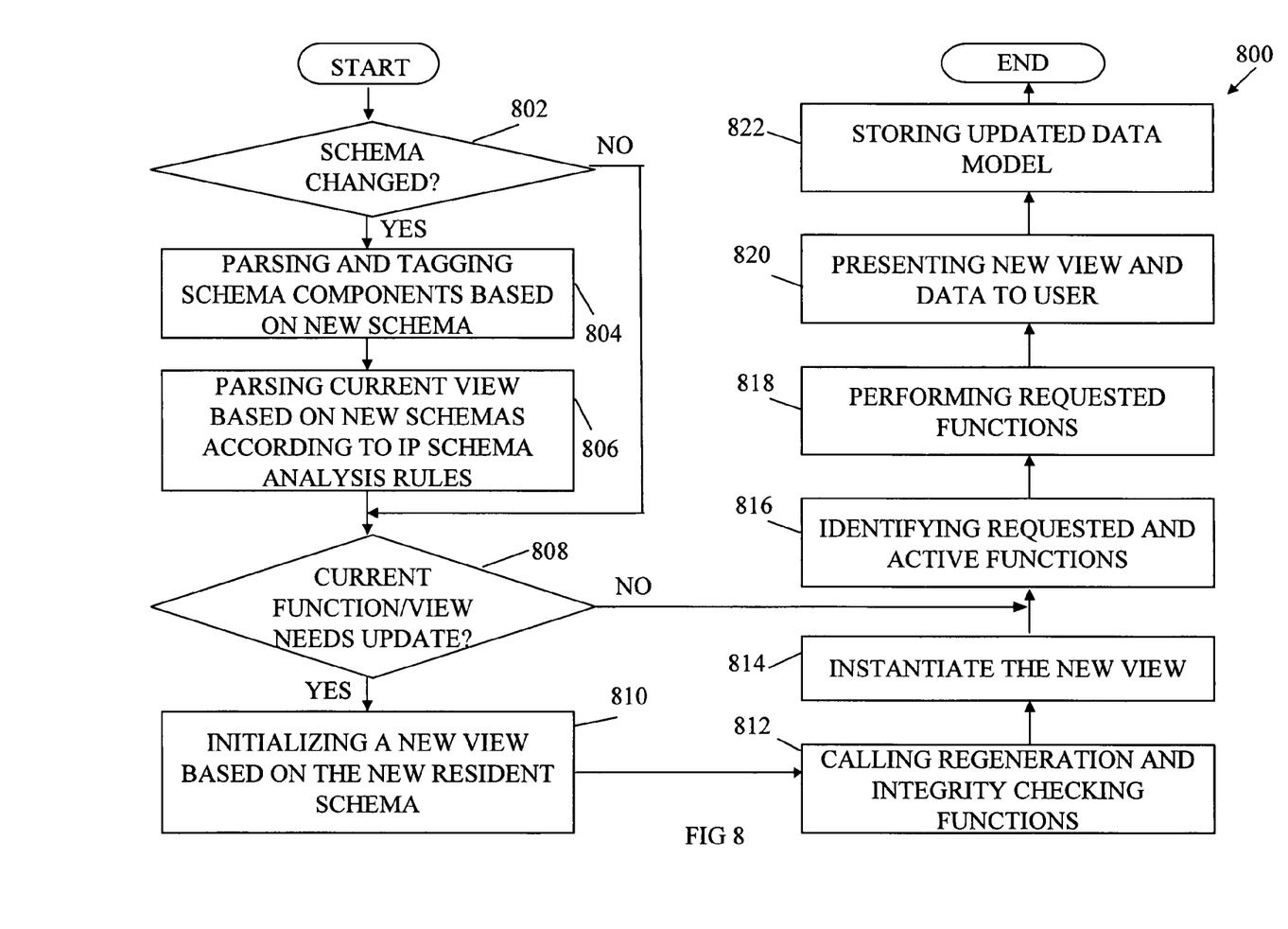
FIG. 8 depicts an example of a flow chart for schema-based self-configuration of functions according to one embodiment.

FIG. 8 depicts an example of a flow chart for schema-based self-configuration of functions according to one embodiment. The elements of flow chart 800 may be performed, in one embodiment, by components or combinations of components of the schema-based IP management module 124. Flow chart 800 may be performed whenever a function of the system is called and need not be performed continuously. Flow chart 800 begins with decision block 802, where the schema manager 202 of the schema-based IP management module 124 determines whether the schema has changed since the last call to the function by checking the resident active schema. The schema manager 202 may accomplish this by determining that the resident schema is a new schema associated with the called function of the silicon IP design and integration system 102 where the new schema is different than the resident schema used in the previous execution of the current function. If the active schema has changed, the method of flow chart 800 may analyze components of the new schema at element 804. Components may include any attributes, data structures, data types, elements, complex elements, access rules, attribute hierarchies an dependencies, or other components. To analyze the components of the new schema, the schema manager 202 may parse and tag the components based on the rules and attributes of the IP schema knowledge base 114. The schema manager 202 may also at element 806 parse the current view based on the new schema, such as by identifying any changed headers, dependencies (between relevant elements, components, groups, etc.) so that all relevant elements and types are identified. At element 806, the schema manager 202 may thus identify all aspects of the view that need to be changed because of the new schema.

The schema manager 202 may determine at decision block 808 whether the current view or function needs to be updated based on the new schema. If no update is required, the method continues to element 816. If an update is required, the method of flow chart 800 may continue to element 810 where the schema manager 202 initializes a new view or reinstantiates the function based on the new resident schema. As described previously, a view may include all of the data, options, links, or anything visible or accessible to the user. After initializing the view, the schema manager 202 may call any regeneration or integrity checking functions at element 812 and then instantiate the new view at element 814. This provides a new view with the information and format appropriate for the new, active schema.

At element 816, the silicon IP design and integration system 102 may identify any requested and active functions and may perform the requested functions at element 818. The silicon IP design and integration system 102 may then (through a user interface) present the new view and data (from the application of the function) to the user at element 820. The silicon IP design and integration system 102 may also optionally store updated information, such as an updated data model, in a silicon IP database 106 at element 822, after which the method terminates. All new design data or updated design files, data files, rules, models, etc. may be marked in the IP database 106 and IP files are stored in the IP file system 112 prior to method termination.

Figure 9:
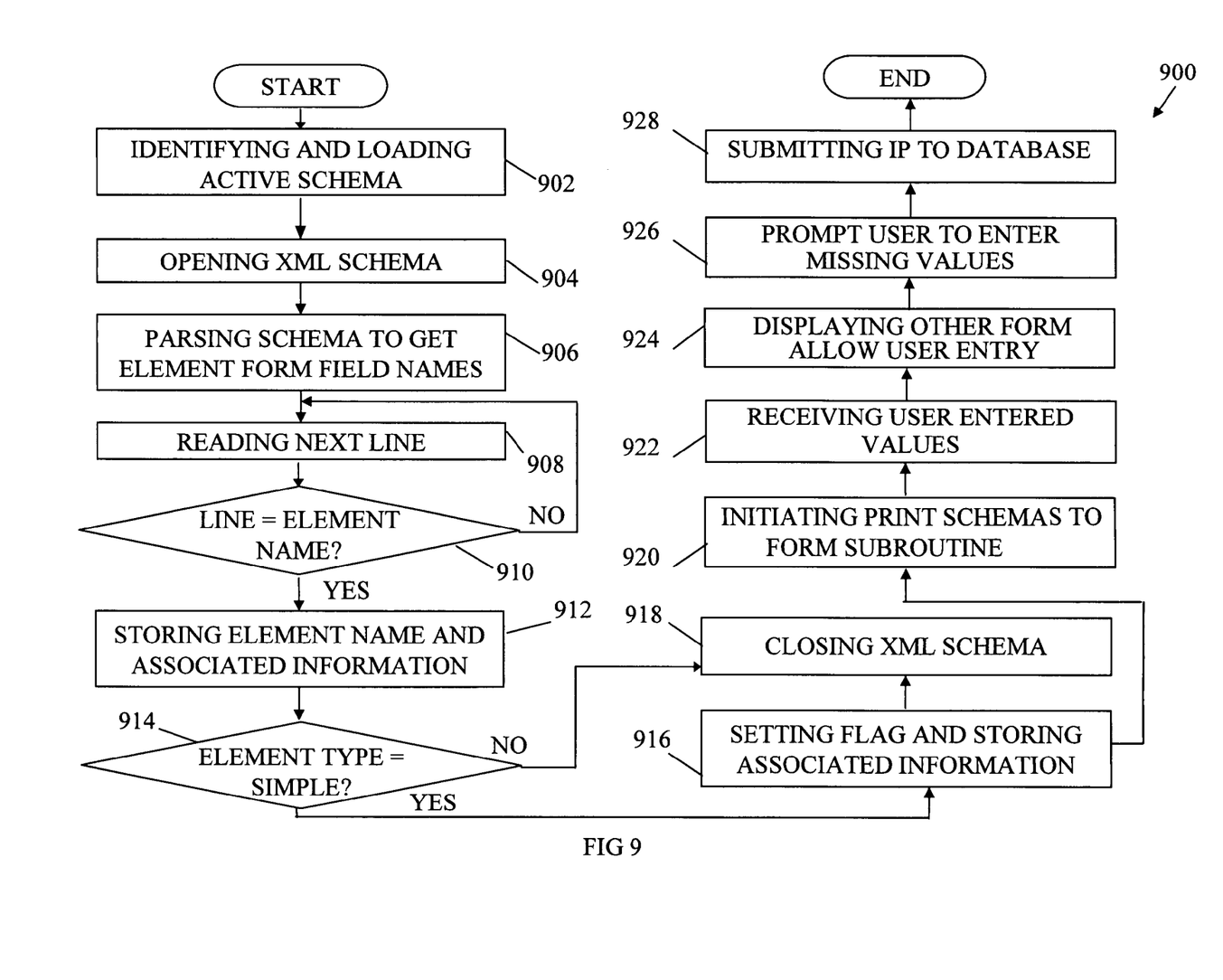
FIG. 9 depicts an example of the flow chart of FIG. 8 for a submit IP function according to one embodiment.

FIG. 9 depicts an example of the flow chart of FIG. 8 for a submit IP function according to one embodiment. The elements of flow chart 900 may be performed, in one embodiment, by components or combinations of components of the schema-based IP management module 124 such as the schema manager 202 and the IP submit module 212 for an XML schema. Flow chart 900 may be performed whenever a request to submit IP function of the system is called. Flow chart 900 begins with decision block 902, where the schema manager 202 of the schema-based IP management module 124 may identify and load the active schema. Variables specifying the program, task and active schema to accomplish this may be presented as pseudo-code such as:

```
$processing_script="submit_ip_form.pl"
$title='Submit your IP information"
$xml_schema_file="blueipportal/xml/blip_ip_schema_MMDDYY.xsd"
``` which generate a request template using the specified schema file. The schema manager 202 may next open the XML schema at element 904 via a command such as:

```
Open(XML_SCHEMA,"$Xml_schema_file")
``` or other code.

After opening the XML schema, the schema manager 202 may then parse the schema to compile a list of elements and their attributes at element 906. To accomplish this, the schema manager 202 may read one line of a schema file at a time. At element 908, the schema manager 202 may read the next line and at decision block 910, it may determine if the line has an element name. If the line does not have an element name, the method of flow chart 900 skips the current line and returns to element 908 to read the next line. Variables specifying the program, task and active schema to accomplish this may be presented as pseudo-code such as:

```
While($line=<XML_SCHEMA>)
$line=~s/<</g
$line=~/>/>/g
```

Each identified element name may be stored, along with any associated information, at element 912, regardless of whether the element is required or not, the type, or the minimum occurrences. Variables specifying the program, task and active schema to accomplish this may be presented as pseudo-code such as:

```
if($line=~/<xsd:element/s+name(\s+\=\s+/=)\"(\w+)\"/
    $element=$2
if($line=~/minOccurs=\"(\d+)\"/
    $num_min_occurrences={element}=$1
if($num_min_occurrences={element})
    $required {element}=1
if($line=~/type(\s+)*=1"(\w+)\"/)
    $type {element} = $2
``` or other code.

The schema manager 202 may also keep track of Simple XML Schema Type Names and set a flag each time a new Simple Type is found. At decision block 914, the method may determine whether the element is a Simple Type and if it is, the schema manager 202 may setting the flag and store the associated information at element 916 and then close the XML schema at element 918. If the Element Type is not a Simple Type, the method may continue to element 918 where the XML schema is closed. Variables specifying the program, task and active schema to accomplish this may be presented as pseudo-code such as:

```
if($line=~simpleType|s+name=\"(\w+)\"/
    $type=$1
    $type_started {type}=1
    Push(@schema_types,$type)
if($line=~lt;V xsd:SimpleType/)
    $type_ended {type}=1
if($line=~\lt;xsd:enumeration\s+value=/)
    push(@{enum_values{$type}}, $enumeration_value)
if($line=~restriction\s+base=\"(\w+)"/
    push(@restriction_bases,$restriction_base{$type}
if($line=~\length\s+value(\s+)*=1"(\d+)\"/
    length{$type}=$2
close XML_SCHEMA
``` or similar code.

After completing the parsing of the schema, the schema manager 202 may initiate a print schema form subroutine at element 920 to instantiate a new view to be presented to the user (similar to element 814 of FIG. 8). In doing this, the schema manager 202 may include in the template to be presented to the user the elements that were parsed from the schema at elements 908 through 918. Variables specifying the program, task and active schema to accomplish this may be presented as pseudo-code such as:

```
&print_schema_form( )
print start_form ("./$processing_script")
if($num_enum_values{$type {element})
print radio_group (-name => "$element)
if($num_selectable_options{$element})
if($num_selectable_options{$element}>6)
print_scrolling_list (-name => $element, -size =>
"list_box_size{$elements}
    else
print checkbox_group (-name=> "$element"
if(!$num_enum_values {$type {$element} && !
$num_selectable_options
    {$element}
    $fieldsize = $length {type {element}
    Print textarea (-name => "$element, -cols => '60, -rows => '3' )
``` or similar code. The schema manager 202 may then receive user entered values at element 922 and may optionally display other forms to allow user entry if any of the values are equal to 'other' at element 924. The schema manager 202 may also prompt users to enter any missing values at element 926. Through these elements, the schema manager 202 may facilitate the entry of all required information to a template in the correct format, data type, etc. Sample code to get the user entered values may include:

```
for each $element (@element_names)
$value{$element}=param("$element")
$new_value {$element} = param ("new_val_$element)
``` or similar code. The schema manager 202 (or IP submit module 212) may submit the IP to the silicon IP database 106 at element 928 once user entry is complete (such as when the user selects a 'form complete' or similar button), after which the method terminates. Sample code to perform element 928 may include:

```
$ip_long_desc_values_list=join(",","@ip_long_desc_values)
$company_info_columns_list = join(@company_infor_fields)
$company_info-values_list = join(@company_info_values)
$general_ip_info_insert_qry='INSERT INTO ip_info
    ($general_ip_columnvs_listt) VALUES ($general_ip_values_list)
$ip_long_desc_insert_qry = INSERT INTO
($ip_long_desc_values_list)
$company_info_insert_qry = INSERT INFO company_info
    ($company_info_columns_list) VALUES
    ($company_into_values_list)
``` or similar code.

While the method of FIG. 9 is described with example programming pseudo-code, one skilled in the art will recognize that alternative programming methods or other languages may also be used. Moreover, while the method of FIG. 9 describes detailed logic associated with a submit IP function, those skilled in the art will recognize that aspects of the disclosed methodology may be used for other IP analysis or integration functions.

Each software program described herein may be operated on any type of computer, such as a personal computer, server, etc. Any program may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates systems, methods, and media for dynamic schema-based silicon IP analysis, qualification, design exchange, or integration. It is understood that the form of the invention shown and described in the detailed description and the drawings are to be taken merely as examples. It is intended that the following claims be interpreted broadly to embrace all the variations of the example embodiments disclosed.

What is claimed is:

1. A method for dynamically adjusting system features based on a schema, the method comprising:
    determining that a new resident schema associated with a function of a silicon IP design system is in a current view, the new resident schema being different than a previous resident schema associated with the current view and being associated with a silicon IP described in a hardware description language, wherein the new resident schema comprises an indication of inputs, outputs, functionality, and interface protocols of a silicon IP;
    analyzing components of the new resident schema by parsing and classifying schema components based on contents of an IP schema knowledge base comprising specifications for one or more silicon IPs each described in a hardware description language;
    parsing the current view based on the new resident schema to extract data from the current view to identify all elements and types to be changed in response to the new resident schema; and
    generating a new view by mapping the extracted data to the new resident schema, the new view comprising viewable data associated with the function of the design system by initializing and configuring the new view based on the new resident schema, calling regeneration and integrity checking functions for the new view, and instantiating the new view.

2. The method of claim 1, further comprising performing the design system function.

3. The method of claim 1, further comprising after generating the new view, configuring and presenting the generated new view to a user.

4. The method of claim 1, further comprising after generating the new view, storing the viewable data in a database.

5. The method of claim 1, further comprising configuring the viewable data to a different schema.

6. The method of claim 1, wherein the function of the silicon IP design system is one or more of a submit IP function, an IP search function, an IP qualify function, an IP quality standard function, or a vendor evaluation function.

7. The method of claim 1, wherein the new resident schema is an XML schema.

* * * * *